(12) United States Patent
Jeswani et al.

(10) Patent No.: US 10,677,400 B2
(45) Date of Patent: Jun. 9, 2020

(54) EDGELIT LIGHT EMITTING DIODE RETROFIT LAMP

(71) Applicant: LEDVANCE LLC, Wilmington, MA (US)

(72) Inventors: Anil Jeswani, Acton, MA (US); Valeriy Zolotykh, Abington, MA (US); Soumya Kanta Ray, Methuen, MA (US)

(73) Assignee: LEDVANCE LLC, Wilmington, MA (US)

( * ) Notice: Subject to any disclaimer, the term of this patent is extended or adjusted under 35 U.S.C. 154(b) by 25 days.

(21) Appl. No.: 15/972,772

(22) Filed: May 7, 2018

(65) Prior Publication Data

US 2019/0338898 A1  Nov. 7, 2019

(51) Int. Cl.
| | |
|---|---|
| *F21K 9/68* | (2016.01) |
| *F21K 9/237* | (2016.01) |
| *F21V 7/24* | (2018.01) |
| *F21W 121/00* | (2006.01) |
| *F21Y 115/10* | (2016.01) |
| *F21Y 113/13* | (2016.01) |
| *H05K 1/18* | (2006.01) |
| *H05K 1/03* | (2006.01) |
| *H05K 1/02* | (2006.01) |
| *F21V 29/70* | (2015.01) |
| *F21Y 103/33* | (2016.01) |
| *F21V 21/14* | (2006.01) |
| *H05B 45/10* | (2020.01) |

(52) U.S. Cl.
CPC ............ *F21K 9/68* (2016.08); *F21K 9/237* (2016.08); *F21V 7/24* (2018.02); *F21V 21/14* (2013.01); *F21V 29/70* (2015.01); *F21W 2121/00* (2013.01); *F21Y 2103/33* (2016.08); *F21Y 2113/13* (2016.08); *F21Y 2115/10* (2016.08); *H05B 45/10* (2020.01); *H05K 1/0203* (2013.01); *H05K 1/0393* (2013.01); *H05K 1/189* (2013.01); *H05K 2201/0154* (2013.01); *H05K 2201/051* (2013.01); *H05K 2201/10106* (2013.01); *H05K 2201/10522* (2013.01)

(58) Field of Classification Search
CPC . F21K 9/232; F21K 9/237; F21K 9/61; F21K 9/68; G02B 6/0063; G09F 13/18
See application file for complete search history.

(56) References Cited

U.S. PATENT DOCUMENTS

| | | | |
|---|---|---|---|
| 8,162,502 B1 * | 4/2012 | Zadro | A45D 42/10 362/141 |
| 8,162,505 B2 * | 4/2012 | Claerhout | F21S 6/004 362/225 |
| 10,041,632 B1 * | 8/2018 | Hsieh | F21V 1/26 |
| 2009/0129054 A1 * | 5/2009 | Meulenbelt | G09F 13/0409 362/97.1 |
| 2013/0044497 A1 * | 2/2013 | Sakamoto | G02B 6/0008 362/311.04 |

(Continued)

*Primary Examiner* — Zheng Song
(74) *Attorney, Agent, or Firm* — Tutunjian & Bitetto

(57) ABSTRACT

An edgelit lamp structure is provided. The lamp structure may include at least one optical diffuser having textured surface to direct light; a frame present on at least a portion of a perimeter of the optical diffuser; and a plurality of solid state light emitters that are present between the frame and the optical diffuser, the solid state light emitters emitting light that is received by the optical diffuser.

16 Claims, 4 Drawing Sheets

(56) References Cited

U.S. PATENT DOCUMENTS

2014/0063847 A1* 3/2014 Sakamoto ............ G02B 6/0031
                                                    362/609
2014/0218964 A1* 8/2014 Kim ..................... F21V 15/01
                                                    362/607
2018/0143370 A1* 5/2018 Marinus .................... F21K 9/61
2018/0313526 A1* 11/2018 Marinus .................. F21V 23/06

* cited by examiner

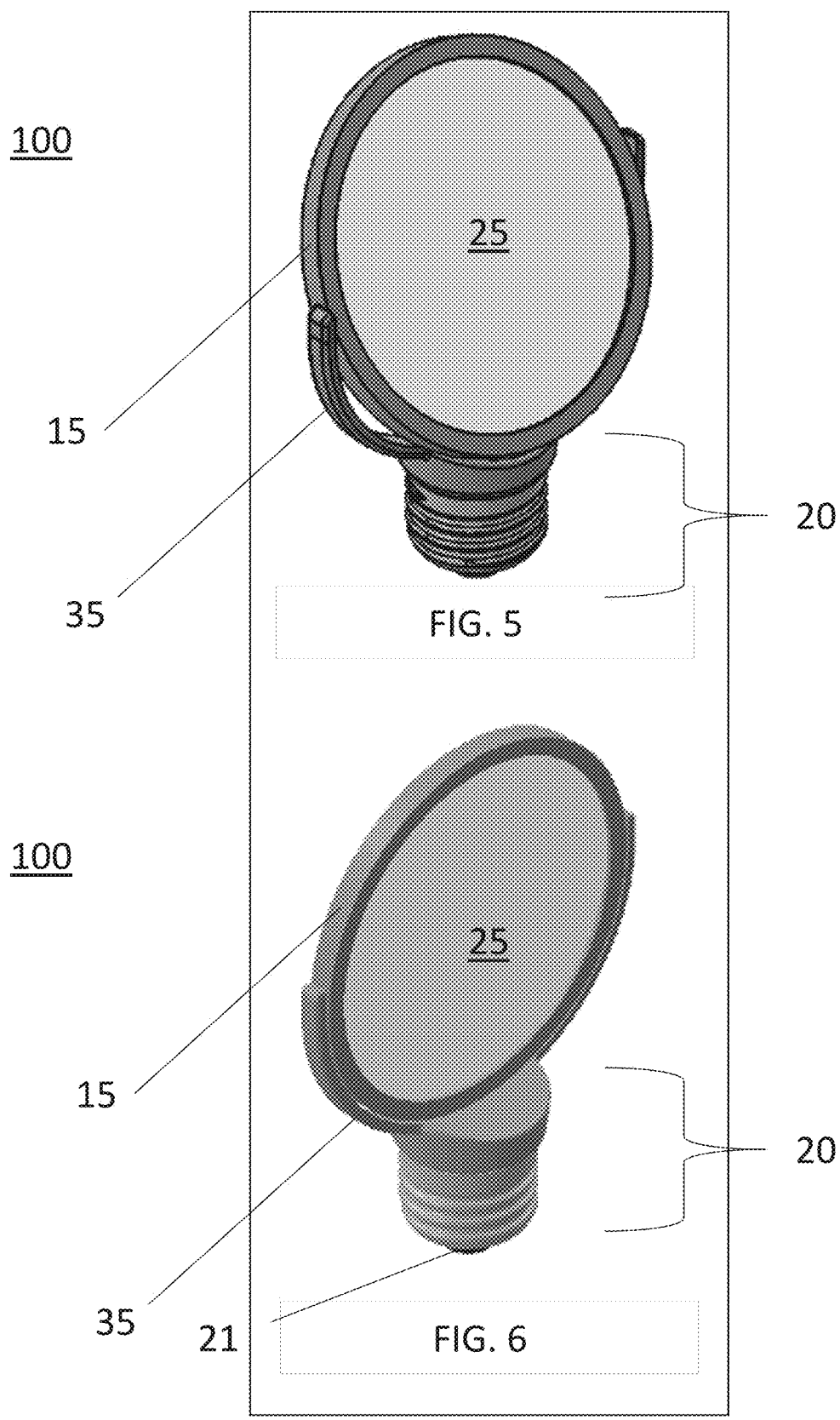

EDGELIT LIGHT EMITTING DIODE RETROFIT LAMP

TECHNICAL FIELD

The present disclosure generally relates to lamp assemblies employing light emitting diodes as the light source.

BACKGROUND

Recently, lighting devices have been developed that make use of light emitting diodes (LEDs) for a variety of lighting applications. Owing to their long lifetime and high energy dficiency, LED lamps are now also designed for replacing traditional incandescent and fluorescent lamps, i.e., for retrofit applications. For such applications, the LED retrofit lamp is typically adapted to fit into the socket of the respective lamp fixture to be retrofitted.

SUMMARY

In one aspect, a lamp is provided that can have a free form design. The lamp design that is provided herein having a solid state light emitter, e.g., LED, light source positioned around a perimeter of an optical diffuser allows for a unique look when compared to a conventional light bulb, such as light bulbs including a fight engine positioned within a globe type optic. Further, the lamp design of the present disclosure can provide lighting performance that is the same or better than the lighting performance of conventional designs.

In one embodiment, the lamp structure includes at least one optical diffuser having polished surface to direct light; a frame present on at least a portion of a perimeter of the optical diffuser; and a plurality of solid state light emitters that are present between the frame and the optical diffuser, the solid state light emitters emitting light that is received by the optical diffuser.

In another embodiment, the lamp structure may include a frame including an interior surface having a track provided by a groove positioned between at least two sidewall rails. A first optical diffuser is present contacting a first rail of the at least two sidewall rails; and a second optical diffuser is present contacting a second rail of the at least two sidewall rails. A plurality of light emitting diodes may be present around a perimeter of the frame within the groove between the first and second optical diffusers.

The disclosed lamp designs may have any outer profile, such as a multi-sided profile, or an arcular profile, i.e., a profile including at least one arc and/or curvature. For example, the outer profile of the disclosed lamp designs may be round, oval, square, rectangular or have the geometry of a hexagon or octagon.

The lamp design may be flexible/adaptable, and can provide either directional or omni light distribution. In some examples, the lamp provides for tailored light distribution on a subject via a rotational/gimbal function of the lamp. In one embodiment, the lamp structure includes a light emitting assembly including at least one optical diffuser having a textured surface to direct light, a light emitting assembly frame present on at least a portion of a perimeter of the optical diffuser, and a plurality of solid state light emitters. The plurality of solid state light emitters may be present between the light emitting assembly frame and the optical diffuser. The solid state light emitters emit light that is received by the optical diffuser. In some embodiments, the lamp further includes a base structure including driver electronics in electrical communication to a socket for engaging a lamp fixture. The lamp may further include connecting frame portions that connect the base structure to the light emitting assembly. The connecting frame portions can include a pathway for electrical communication between the driver electronics and the solid state light emitters. The connecting frame portions may be in rotational engagement to the light emitting assembly.

BRIEF DESCRIPTION OF THE DRAWINGS

The following description will provide details of embodiments with reference to the following figures wherein:

FIG. 5 is a perspective view of another embodiment of lamp including a plurality of solid state light emitters, e.g., light emitting diodes (LEDs), that are positioned within a track that also retains an optical diffuser, in which the lamp further includes a rotational/gimbal function tailored for controlling light distribution on a subject via a of the lamp, wherein the optical diffuser is in a tilted position.

FIG. 6 is a perspective view of another embodiment of lamp including a plurality of solid state light emitters, e.g., light emitting diodes (LEDs), that are positioned within a track that also retains an optical diffuser, in which the lamp further includes a rotational/gimbal function tailored for controlling light distribution on a subject being illuminated by the lamp, wherein the optical diffuser is in a straight position.

DETAILED DESCRIPTION

Figure 1:
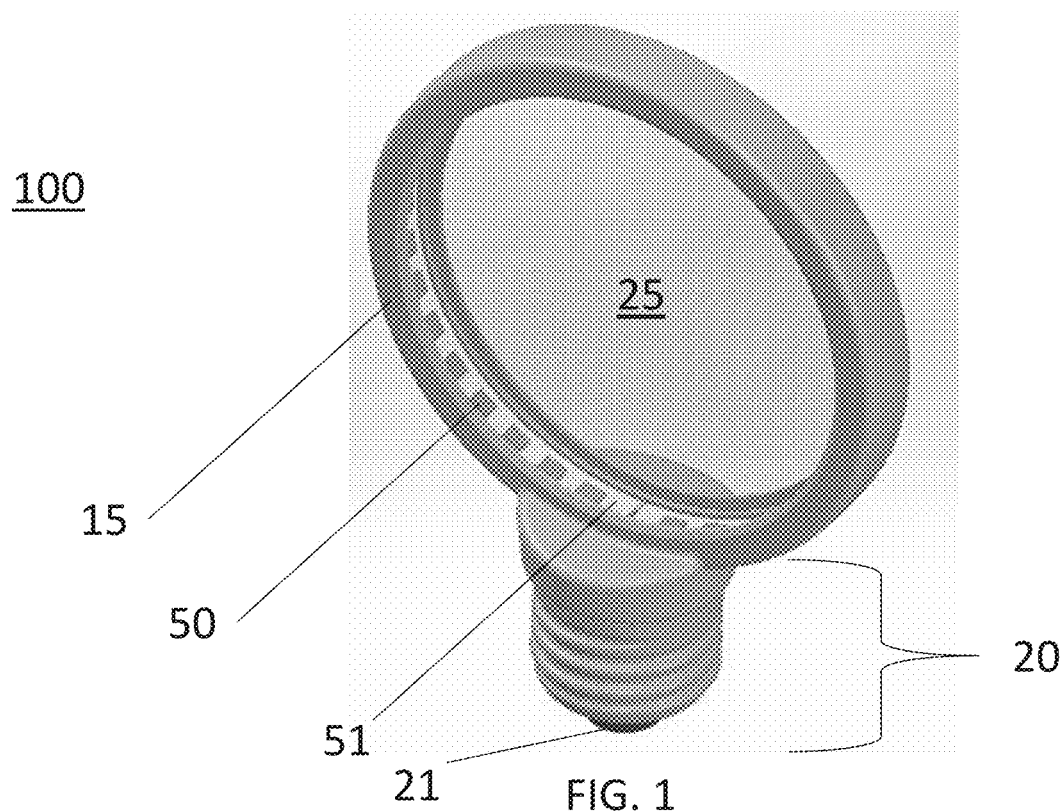
FIG. 1 is a perspective view of a lamp including a plurality of solid state light emitters, e.g., light emitting diodes (LEDs), that are positioned within a track that in addition to containing the solid state light emitters also retains an optical diffuser, which can provide omni light distribution, in accordance with one embodiment of the present disclosure.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

In some embodiments, the present disclosure provides an Edgelit light emitting diode (LED) retrofit lamp is provided for use with existing lamp sockets, such as light sockets having standards E26, E27, GU24 bases, etc. The lamp structures provided herein can provide a sleek/free form lamp outer profile/shape, flexible light distribution, and improved aesthetics. Additionally, the lamp designs of the present disclosure meets the performance characteristics and requirements of traditional form factor lamps.

Prior to the lamp designs of the present disclosure, if Omni light distribution was needed in an application, a user would install a traditional A, B or G type lamp. An "Omni" light casts rays in all directions from a single source. Additionally, if directional light was needed, the user would install, e.g., a BR-lamp. A "directional light" casts light in substantially a single direction, or family of directions, from a single source. Prior to the lamp designs of the present disclosure, if tailored light distribution on a subject was needed, light fixtures with gimbal function was used in conjunction with traditional lamps. The lamp designs of the present disclosure can provide a directional light distribution by changing the orientation of the optical element.

As will be described in further detail below, the lamp designs of the present disclosure are flexible enough to provide both omni light distribution and/or directional light output. The systems provided by the lamp designs of the present disclosure allow for flexibility in adapting the light distribution to the subject just by rotating the optical element to a desired position. The lamp designs of the present disclosure also have a sleek appearance. In some embodiments, the proposed Edgelit retrofit lamp can be used as a replacement for traditional A, B, G, BR and PAR lamps. In some embodiments, the Edgelit retrofit lamp include solid state light emitters, e.g., light emitting diodes (LEDs), on a flexible printed circuit board (PCB); an outer frame that dictates the outer lamp form; and driver electronics and controls that are mounted in the base or a plastic enclosure around the base of the lamp. In some embodiments, an optional back reflector cover may be employed for directional lighting. In some embodiments, the optical diffuser can efficiently distribute the light from the light emitting diodes (LEDs) through the disk out of the optical disk. The lamp structures of the present disclosure are now described with greater detail with reference to FIGS. 1-7.

FIG. 1 depicts one embodiment of a lamp 100 including a plurality of solid state light emitters, e.g., light emitting diodes (LEDs) 50, that are positioned within a track of a frame 15 that in addition to containing the solid state light emitters also retains an optical diffuser 25, which can provide omni light distribution. The term "lamp" refers to any device for producing light. In some embodiments, the lamp 100 may include at least one optical diffuser 25 having textured surface to direct light; a frame 15 present on at least a portion of a perimeter of the optical diffuser 25; and a plurality of solid state light emitters, e.g., light emitting diodes (LEDs) 50, that are present between the frame 15 and the optical diffuser 25, the solid state light emitters, e.g., light emitting diodes (LEDs) 50, emitting light that is received by the optical diffuser 25.

Figure 2:
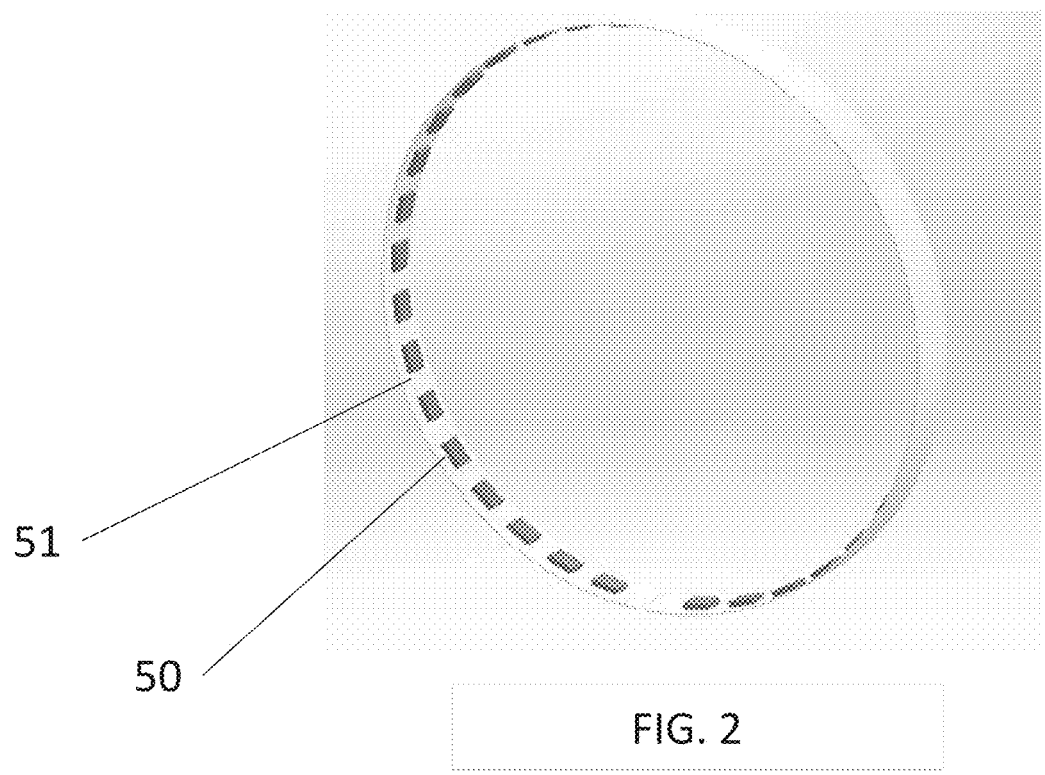
FIG. 2 is a perspective view of a plurality of light emitting diodes (LEDs) present on a flexible substrate that can provide the light source of the lamp structures of the present disclosure.

In some embodiments, the plurality of solid state light emitters are light emitting diodes (LEDs). FIG. 2 depicts a plurality of light emitting diodes (LEDs) 50 present on a flexible substrate 51 that can provide the light source of the lamp structures 100 of the present disclosure. The light emitting diodes (LEDs) 50 may be surface mount device (SMD) light emitting diodes (LEDs), referred to as SMD LEDs. An SMD LED Module surface-mount device light-emitting diode module) is a type of LED module that uses surface-mount technology (SMT) to mount LED chips on printed circuit boards (PCB). As noted above, the PCB may be flexible, i.e., a flexible substrate 51.

In some embodiments, the SMD LEDs may be of a single color, and may be non-addressable. In this example, every LED 50 on the flexible substrate 51 is a single white color, typically ranging from 2700K to 6500K in color temperature, or any of several monochrome colors covering the range of the visible spectrum, e.g., from 400-700 nanometers in wavelength.

In some embodiments, the SMD LEDs may be multicolor and non-addressable. In this example, each LED 50 can display red, green, blue, or all three (white), driven by three input power rails. AU the LEDs 50 can display the same color at any one time, but the color can be manipulated by varying the voltage applied to each of the three power inputs.

In some embodiments, the SMD LEDs may be RGB and addressable. In this example, each LED 50 is cable of multiple colors and addresses. In this example, each LED 50 on the flexible substrate 51 can have its own chip, which means they can be individually triggered for chasing, strobing, and color changing.

In some embodiments, the flexible substrate 51 may be populated with many different types of LEDs 50, e.g., SMD LEDs, not only in different colors and addressable or non-addressable, by different shapes, sizes, and power levels. The most common types of SMD are: 3528, single color, non-addressable, very low power; 5050, containing three LEDs allowing for RGB and addressable strips as well as higher power levels; 2835, a single-color SMD having the same surface dimensions as the 3528 but a larger emitter area and a thinner design with an integrated heatsink allowing for higher power levels; 5630/5730, and single-color 5050 SMDs. Less common designs for the SMD LEDs can include 3014, 4014, 7020, 8020, or other SMDs.

The flexible substrate 51 may be composed of a polymer material. Polyimides provide excellent durability and heat resistance and have a flexibility that is suitable for the flexible substrate 51. Starting with a layer of copper which acts as the base circuit, one core layer and two outer layers of polyimide polymer, such as Kapton, are applied using a flexible adhesive. The three layers of polyimide provides the copper layer with protection and structural integrity. There are small areas where the copper must remain exposed, however, so that the LEDs 50 and other components can make electrical contact. Finally, a layer of double sided tape is applied to the back of the flexible substrate 51. In one example, 3M 200MP is the double-sided adhesive used for this purpose.

The LEDs 50 on the flexible substrate 51 can operate on 12 or 24 volts (or lower) of direct current from a power supply, sometimes referred to as a driver. In some embodiments, PCB designs use multiple parallel circuits consisting of passive dropper resistors in series with a certain number of LED SMDs, to operate at a certain current and power level with the expected input voltage. This design is referred to as constant-voltage and is rather sensitive to small variations in input voltage and to the voltage drop that occurs along long lengths of strip when driven from a single power input. In some embodiments, the LEDs 50 can be controlled by a controller, e.g., microcontroller, to adjust brightness, color, or individual LED activity. This can be done with an included controller or customized with a microcontroller.

It is noted that the number of LEDs 50 on the flexible substrate 51 may vary. For example, the number of LEDs 50 may range from 4 LEDs to 20 LEDs. In another example, the number of LEDs 50 may range from 5 LEDs to 15 LEDs. It is noted that the above examples are provided for illustrative purposes only and are not intended to limit the present disclosure, as any number of LEDs 50 may be present the flexible substrate 51. In some other examples, the number of LEDs 50 may be equal to 4, 5, 6, 7, 8, 9, 10, 11, 12, 13 14, 15, 16, 17, 18, 19, 20 and 25, as well as any range of LEDs 50 with one of the aforementioned examples as a lower limit to the range, and one of the aforementioned examples as an upper limit to the range.

Referring to FIG. 2, it is noted that the assembly of the LEDs 50 on the flexible substrate 51 may have geometry including at least on arc, such as the depicted circular structure. The present disclosure is not limited to only this example. The assembly of the LEDs 50 and the flexible PCB 51 may have any geometry that can be engaged into the frame 15, which in turn may correspond to the outside geometry of the optical diffuser 25. For example, the exterior geometry, i.e., geometry of the perimeter of the optical diffuser 25, may be oblong, elliptical, or multi-sided. Multi-sided geometries for the exterior geometry of the assembly of the LEDs 50 and the flexible PCB 51 may include a rectangle, a triangle, square, rhombus, parallelogram, kite, trapezoid, pentagon, hexagon, heptagon, octagon, nonagon, decagon, and other multi-sided geometries.

It is noted that any geometry is suitable for the assembly of the LEDs 50 and the flexible PCB 51 so long as the light emitting diodes are positioned about the perimeter of the at least one optical diffuser 25.

It is noted that the above description of the light emitting diodes (LEDs) 50 is provided for illustrative purposes only, and is not intended to limit the present disclosure. For example, in some embodiments, the LEDs 50 of the lamp 100 are selected to be capable of being adjusted for the color of the light they emit. The term "color" denotes a phenomenon of light or visual perception that can enable one to differentiate objects. Color may describe an aspect of the appearance of objects and light sources in terms of hue, brightness, and saturation. Some examples of colors that may be suitable for use with the method of controlling lighting in accordance with the methods, structures and computer program products described herein can include red (R), orange (O), yellow (Y), green (G), blue (B), indigo (I), violet (V) and combinations thereof, as well as the numerous shades of the aforementioned families of colors. It is noted that the aforementioned colors are provided for illustrative purposes only and are not intended to limit the present disclosure as any distinguishable color may be suitable for the methods, systems and computer program products described herein.

The LEDs 50 of the lamp 100 may also be selected to allow for adjusting the "color temperature" of the light they emit. The color temperature of a light source is the temperature of an ideal black-body radiator that radiates light of a color comparable to that of the light source. Color temperature is a characteristic of visible light that has applications in lighting, photography, videography, publishing, manufacturing, astrophysics, horticulture, and other fields. Color temperature is meaningful for light sources that do in fact correspond somewhat closely to the radiation of some black body, i.e., those on a line from reddish/orange via yellow and more or less white to blueish white. Color temperature is conventionally expressed in kelvins, using the symbol K, a unit of measure for absolute temperature. Color temperatures over 5000 K are called "cool colors" (bluish white), while lower color temperatures (2700-3000 K) are called "warm colors" (yellowish white through red). "Warm" in this context is an analogy to radiated heat flux of traditional incandescent lighting rather than temperature. The spectral peak of warm-colored light is closer to infrared, and most natural warm-colored light sources emit significant infrared radiation. The LEDs 50 of the lamps provided by the present disclosure in some embodiments can be adjusted from 2000K to 7000K.

The LEDs 50 of the lamp 100 may also be selected to be capable of adjusting the light intensity/dimming of the light they emit. In some examples, dimming or light intensity may be measured using lux. In some embodiments, the dimming or light intensity adjustment of the LEDs 50 can provide for adjusting lighting between 100 lux to 1000 lux. For example, lighting for office work may be comfortably done at a value between 250 lux to 500 lux. For greater intensity applications, such as work areas that involve drawing or other detail work, the intensity of the lamps are illuminated to a range within 750 lux to 1,000 lux.

In some embodiments, other light sources may either be substituted for the LEDs 50, or used in combination with the LEDs 50, such as organic light-emitting diodes (OLEDs), a polymer light-emitting diode (PLED), and/or a combination of any one or more thereof.

Referring to FIG. 1, the lamp structure 100 includes at least one optical diffuser 25 having textured surface to direct light; a frame 15 present on at least a portion of a perimeter of the optical diffuser 25; and a plurality of light emitting diodes (LEDs) 50 that are present between the frame 15 and the optical diffuser 25, in which the light emitted by the light emitting diodes (LEDs) 50 is received by the optical diffuser 25. In some embodiments, the optical diffuser 25 is used to evenly diffuse light. The optical diffuser 25 may contribute to the emission of Omni light by the lamp 100 or directional light by the lamp 100. In some examples, the optical diffuser 25 can cause light to spread evenly across a surface, minimizing or removing high intensity bright spots. In one embodiment, the optical diffuser 25 has a plastic composition selected from the group consisting of acrylic, polystyrene, polycarbonate, Cyclic Olefin Polymer (COP), Cyclic Olefin Copolymer (COC), NAS copolymer and combinations thereof. Acrylic and polycarbonate are tough, lightweight, plastic sheet materials with outstanding optical properties that are suitable for use with the optical diffuser 25. Both are capable of being machined and thermoformed into complex shapes. Special grades of acrylic sheet, polycarbonate sheet, and polycarbonate film are engineered to diffuse LED hot spots without sacrificing light transmission. LED light diffusing acrylics including OPTIX® LD, OPTIX®95 LED, OPTIX® Frost LED, and Plexiglas® Sylk are engineered to diffuse hot spots while maintaining very high light transmission. Polycarbonate sheet for lighting applications can be cold formed into complex shapes such as curved light diffusers.

Acrylite® is an acrylic available from Evonik Cyril LLC. that is suitable for use as the composition of the optical diffuser 25.

Makrolon® Lumen XT is a translucent, white polycarbonate sheet with LED light diffusing additives and a textured surface. This material can diffuse LED hot spots while still having high light transmission. Makrolon® Lumen XT is available in a number of different formulations. Makrolon® Lumen XT-V has enhanced flammability characteristics and is intended for lighting applications where the most stringent flammability performance is required. Makrolon® DX-NR is a translucent polycarbonate sheet designed for outdoor use with a non-reflective UV texture on one side. Makrolon® Lumen XT materials are durable and they are available in grades with different light transmission and light diffusion values as well as warm and cool tints. Makrofol® LM polycarbonate films offer unsurpassed design flexibility for light diffusing applications. These materials have textured surfaces and LED light diffusing additives to hide hot spots while still maintaining high light transmission.

It is noted that the above compositions for the optical diffuser 25 are provided for illustrative purposes only, and are not intended to limit the present disclosure. For example, in addition to polymeric compositions for the optical diffuser 25, the optical diffuser 25 may also be composed of materials of a glass composition.

In some examples, the surface of the optical diffuser 25 has been textured. In many applications, the texture is provided by a surface roughness in the exterior faces of the optical diffuser 25. Surface roughness may be obtained in several ways. In the case of a cast sheet, the glass mold, which forms the sheet, may have a surface roughness that has been obtained by treating the material, e.g., glass, of the mold, for example with hydrofluoric acid. Sandblasting may also be used. A textured roller may be used with extruded sheet. In some other embodiments, particles in the composition can also produce surface roughness, as the particles partially protrude from the surface especially as the thermoplastic matrix cools and recedes. Particles having a mean particle size of from 30 to 80 microns and preferably 40 to 65 microns can produce a desired surface roughness. The surface roughness, denoted by Ra, is expressed in microns and can be measured using a roughness meter (for example of the Talysurf Surtronic 3P brand from Rank-Taylor-Hobson) according to the ISO 4287 and ISO 4288 standards. A surface roughness of between 0.5 and 4 µm, preferably between 1 and 3 µm on at least one of the faces of the cover allows the light-scattering effect of the scattering particles to be enhanced.

In some embodiments, the optical diffuser 25 has a geometry with a perimeter defined by at least one arc, or a perimeter that is multi-sided. For example, the optical diffuser 25 may be circular, ellipse or oblong, as depicted in FIG. 1. In other examples, the optical diffuser 25 may be multi-sided, such as being a rectangle, a triangle, square, rhombus, parallelogram, kite, trapezoid, pentagon, hexagon, heptagon, octagon, nonagon, decagon, and other multi-sided geometries.

The optical diffuser 25 may be planar, i.e., composed of a sheet material, or the optical diffuser 25 may include a curvature to provide a convex or concave shape relative to the centerline of the lamp 100.

Still referring to FIG. 1, in some embodiments, a frame 15 is used to engage both the optical diffuser 25 and the assembly of the light emitting diodes (LEDs) 50 and a flexible printed circuit board 51. The frame 15 may be composed of a plastic, metal, composite and/or wood based material. In one example, in which the frame 15 is composed of a plastic, the frame 15 may be made of PBT (Polybutylene-terephthalate) or PET (polyethylene-terephthalate) fire retarded plastic with a bromine-containing, polymer and antimony oxide. The frame 15 can be composed of a plastic that can be glass fiber filled. In one example, in which the frame 15 is composed of a metal, the frame 15 can be composed of aluminum.

The exterior geometry of the frame 15 may correspond to the exterior geometry of the optical diffuser 25. For example, when the exterior geometry of the optical diffuser 25 is a circular, the exterior geometry of the frame 15 may also be circular. In another example, when the exterior geometry of the optical diffuser is rectangular, the exterior geometry of the frame may also be rectangular.

The frame 15 includes an interior surface including a track provided by a groove positioned between at least two sidewall rails, wherein the light emitting diodes (LEDs) 50 are present within the groove, and the optical diffuser 25 contacts the sidewall rails to provide that the light emitting diodes 50 are encapsulated between the frame 15 and the optical diffuser 25. In some embodiments, the frame 15 when viewed as a cross-section across the track may have a U-shaped geometry, in which the vertically orientated portions of the U-shaped geometry provide the sidewall rails, and the horizontally orientated portions of the U-shaped geometry, provides the groove. In some embodiments, the assembly of the LEDs 50 and the flexible PCB 51 may be engaged to the groove. For example, the backside of the flexible PCB 51 that is opposite the surface that the light emitting diodes (LEDs) 50, e.g., SMD LEDs, are mounted on is engaged to the groove by adhesive engagement via an adhesive tape. It is noted that this is only one example of adhesive engagement; and it is noted that the present disclosure is not intended to be limited to only this example. Friction fit, and well as glue adhesive engagement, may also be employed to position the assembly of the LEDs 50 and the flexible PCB 51 within the groove. In some embodiments, a single optical diffuser is engaged along its perimeter to both the side rails of the frame, in which the assembly of the LEDs 50 and the flexible PCB 51 is encapsulated between the groove and sidewall surfaces of the frame 15, and the perimeter of the optical diffuser 25 that is engaged to the sidewall surfaces of the frame 15. By encapsulating the light emitting diodes 50 between the frame 15 and the optical diffuser 25, the light emitted from the light emitting diodes 50 are received by the optical diffuser 25 and then distributed through the optical diffuser 25. In some embodiments, the optical diffuser 25, such as the texture of the optical diffuser 25, can then provide that the light is emitted from the lamp 100 in as an Omni light or a directional light.

Figure 4:
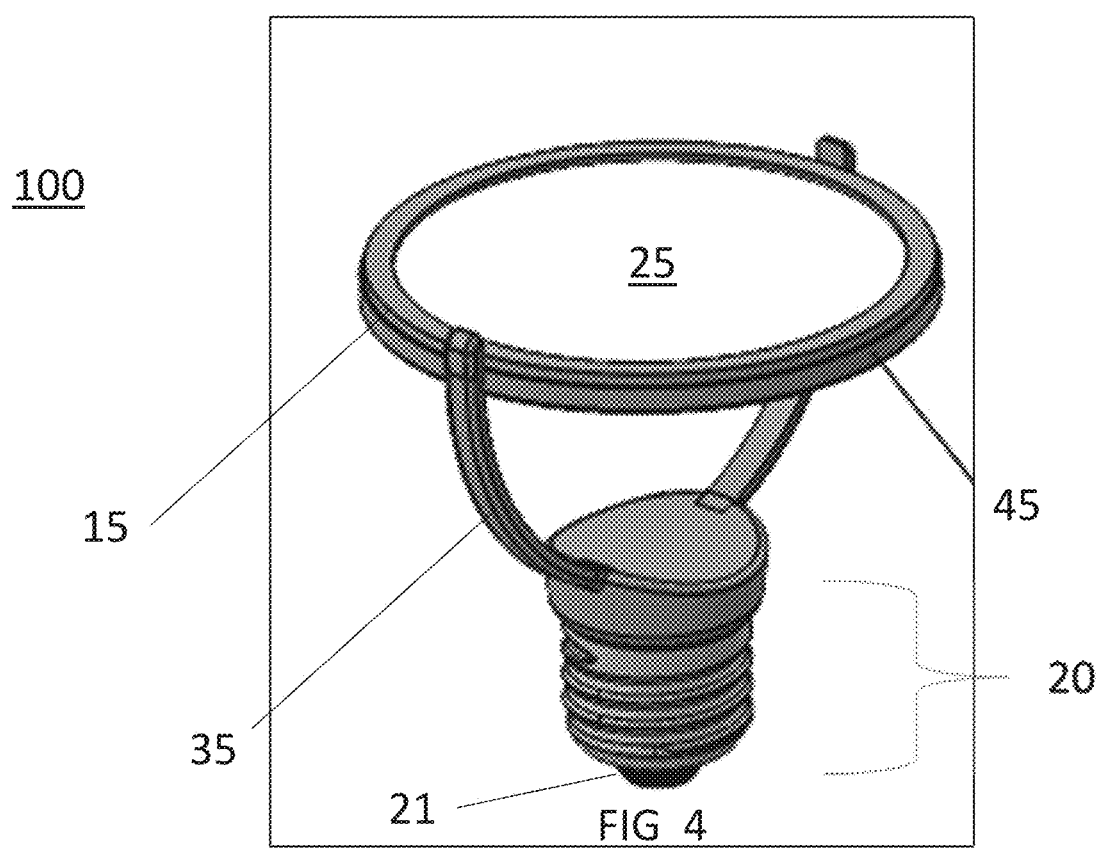
FIG. 4 is a perspective view of another embodiment of a lamp having a plurality of solid state light emitters, e.g., light emitting diodes (LEDs), that are positioned within a track that also retains an optical diffuser, wherein the lamp further includes a reflective backing to produce a directional light distribution.

In some embodiments, a reflector 45 may contribute to providing that the light emitted from the lamp 100 is directional, as depicted in FIG. 4. The reflector 45 may be composed of any light reflective material, such as metals or plastics. In some embodiments, the reflector 45 may have a mirrored surface. In some embodiments, the reflector 45 is positioned in contact with the surface of the optical diffuser 25 that the user wishes to block the direction of light from traveling. In the example depicted in FIG. 4, the light travels in a direction through the surface of the optical diffuser 25 opposite the surface of the optical diffuser 25 that the reflector 45 is present on.

Figure 3:
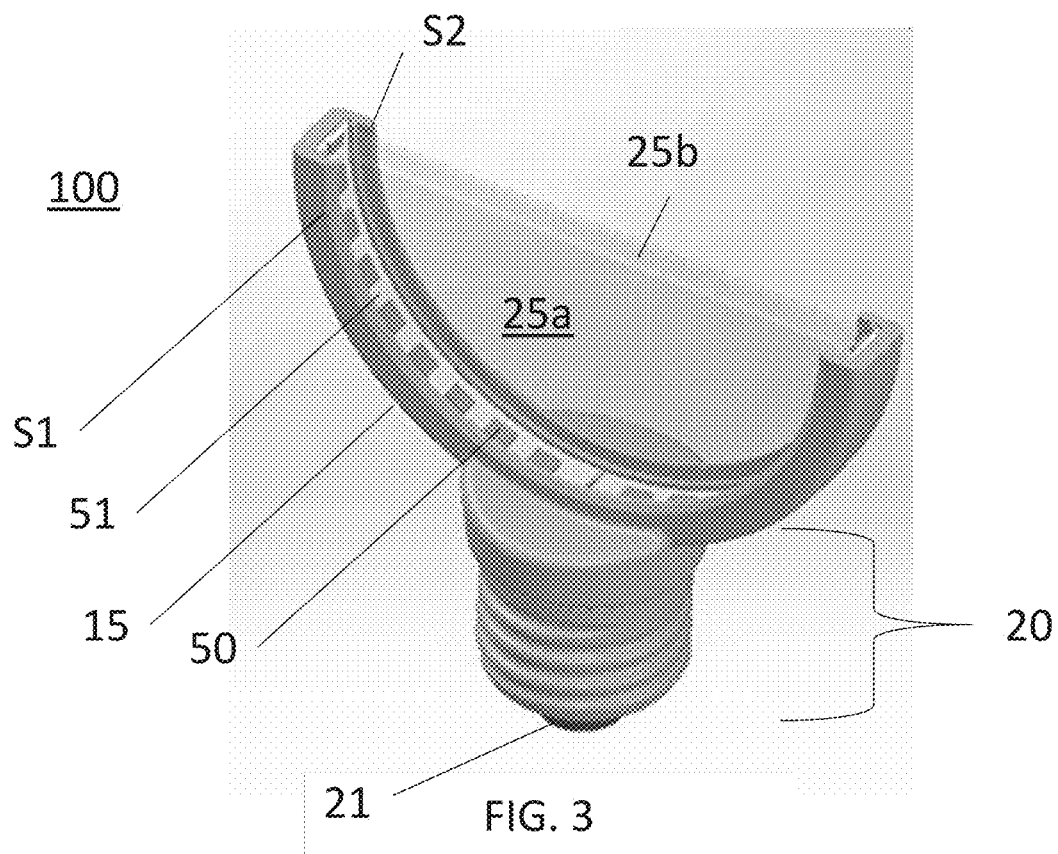
FIG. 3 is a cross-sectional view of a lamp structure having a frame including an interior surface with a track provided by a groove positioned between at least two sidewall rails, a first optical diffuser is present contacting a first rail of the at least two sidewall rails, a second optical diffuser is present contacting a second rail of the at least two sidewall rails, and a plurality of light emitting diodes present around a perimeter of the frame within the groove between the first and second optical diffusers.

FIG. 3 illustrates another embodiment of a lamp structure 100 having a frame 15 including an interior surface with a track provided by a groove positioned between at least two sidewall rails S1, S2, a first optical diffuser 25a that is present contacting a first rail S1 of the at least two sidewall rails, a second optical diffuser 25b that is present contacting a second rail S2 of the at least two sidewall rails, and a plurality of light emitting diodes 50 present around a perimeter of the frame 15 within the groove between the first and second optical diffusers 25a, 25b.

The example depicted in FIG. 3 is provided for illustrative purposes only, and is not intended to limit the present disclosure. For example, the number of optical diffusers does not have to be limited to one or two, as the number of optical diffusers may be increased, and more than one assembly of light emitting diodes (LEDs) 50 may be present in the track provided by the interior surface of the frame 15.

In the embodiment that is depicted in FIG. 1, the frame 15 is engaged in a fixed arrangement with the base housing 20 of the lamp 100. The frame 15 may be engaged to the base of the lamp 100 by a molded engagement, adhesive engagement and/or engagement by mechanical fasteners. The present disclosure is not limited to only this example. For example, embodiments of the present disclosure can provide for tailored light distribution on a subject via a gimbal function of the lamp 100, as depicted in FIGS. 4-6. It is noted that the base housing 20 that is depicted in FIG. 1, is described with greater detail with reference to FIGS. 4-6.

FIGS. 4-6 depict one embodiment of a lamp structure 100 having a light emitting assembly that includes at least one optical diffuser 25 having textured surface to direct light, a light emitting assembly frame 15 present on at least a portion of a perimeter of the optical diffuser 25, and a plurality of solid state light emitters, e.g., LEDs 50, that are present between the light emitting assembly frame 15 and the optical diffuser 25. The at least one optical diffuser 25 and the plurality of solid state light emitters, e.g., LEDs 50, that are depicted in FIGS. 4-6 have been described above with reference to FIGS. 1-3. Therefore, the above description of the at least one optical diffuser 25 that is depicted in FIGS. 1-3 can provide at least one embodiment of the at least one optical diffuser 25 that is depicted in FIGS. 4-6. Additionally, the light emitting assembly frame 15 has been described above in the description of the frame having reference number 15 that has been described with reference to FIGS. 1-3. The solid state light emitters in the embodiments depicted in FIGS. 4-6 are similar to the solid state light emitters that have been described with reference to FIGS. 1-3. For example, the solid state light emitters that are depicted in FIGS. 4-6 may be light emitting diodes (LEDs) 50, and in some examples may be surface mount device (SMI)) light emitting diodes (LEDs) that are mounted to a flexible substrate, such as a flexible printed circuit board (PCB) 51. Similar to the embodiments that are described with reference to FIGS. 1-3, for the lamp structure 100 depicted in FIGS. 4-6, the light emitted by the light emitting diodes (LEDs) 50 may be received by the optical diffuser 25, and the light emitted from the optical diffuser 25 may be emitted in an Omni light form, or a directional light form. In some embodiments, the light emitting diodes 50 are positioned about an entirety of the perimeter of the at least one optical diffuser 25.

In some embodiments, a reflector 45 may contribute to providing that the light emitted from the lamp 100 is directional, as depicted in FIG. 4. The reflector 45 may be composed of any light reflective material, such as metals or plastics. In some embodiments, the reflector 45 may have a mirrored surface. In some embodiments, the reflector 45 is positioned in contact with the surface of the optical diffuser 25 that the user wishes to block the direction of light from traveling. In the example depicted in FIG. 4, the light travels in a direction through the surface of the optical diffuser 25 opposite the surface of the optical diffuser 25 that the reflector 45 is present on.

Referring to FIGS. 4-6, the lamp structure 100 may also include a base housing 20 including driver electronics in electrical communication to a socket for engaging a lamp fixture; and connecting frame portions 35 connecting the base housing 20 to the light emitting assembly. In one embodiment, the driver electronics, e.g., lighting circuit, is a circuit for causing the LEDs 50 to emit light, and is housed in the base housing 20. More specifically, the driver electronics, e.g., lighting circuit, includes a plurality of circuit elements, and a circuit board on which each of the circuit elements is mounted. In this embodiment, the driver electronics, e.g., lighting circuit, converts the AC power received from the base housing 20 to the DC power, and supplies the DC power to the LEDs 50 through the two lead wires. In one embodiment, the driver electronics is a lighting circuit that may include a diode bridge for rectification, a capacitor for smoothing, and a resistor for adjusting current. The lighting circuit is not limited to a smoothing circuit, but may be an appropriate combination of light-adjusting circuit, voltage booster, and others.

The driver electronics may be housed within a base housing 20 that is composed of a resin material. The base housing 20 can be made of PBT (Polybutylene-terephthalate) or PET (Polyethylene-terephthalate) fire retarded plastic with a bromine-containing polymer and antimony oxide. The base housing 20 can be glass fiber filled. The base 21 is connected to the end of the base housing 20 that is opposite the end of the base housing 20 that is closest to the optical diffuser 25. In the embodiment that is depicted in the supplied figures, the base 21 is an E26 base. The lamp 100 can be attached to a socket for E26 base connected to the commercial AC power source for use. Note that, the base 21 does not have to be an E26 base, and maybe a base of other size, such as E11. In addition, the base 21 does not have to be a screw base, and may be a base in a different shape such as a plug-in base.

Referring to FIGS. 4-6, the lamp structure 100 may also include connecting frame portions 35 connecting the base housing 20 to the light emitting assembly. In the embodiments that are depicted in FIGS. 4-6, the connecting frame portions 35 are connected to the light emitting assembly frame 15 by rotating connection (also referred to as rotational connection), which can provide the gimbal function of the lamp 100. For example, the rotation connection between the light assembly frame 15 and the connecting frame portions 35 can be by swivel connection.

A swivel is a connection that allows the connected object, e.g., light assembly frame 15 connected to the optical diffuser 25 and the assembly of the light emitting diodes (LEDs) 50 and the flexible printed circuit board (PCB), to rotate horizontally or vertically.

In one embodiment, a swivel is a cylindrical rod that can turn freely within a support structure. The rod is usually prevented from slipping out by a nut, washer or thickening of the rod. The support structure is typically connected to the connecting frame portion 35, and the light assembly frame 15 can be attached to the ends of the rod or the center, or vice versa. In another embodiment, the swivel that provides the gimbal function of the lamp 100 includes a sphere that is able to rotate within a support structure. The light assembly frame 15 can be attached to the sphere, and the support structure can be connected with the connecting frame portions 35, or vice versa. In another embodiment, the swivel that provides the gimbal function of the lamp 100 includes a hollow cylindrical rod that has a rod that is slightly smaller than its inside diameter inside of it. They are prevented from coming apart by flanges. The light assembly frame 15 and the connecting frame portions 35 may be attached to either end.

The rotational connection between the light assembly frame 15 and the connecting frame portions 35 allows for the light assembly frame 15, as well as the connected optical diffuser 25 and the assembly of the light emitting diodes (LEDs) 50 and flexible printed circuit board (PCB) 51, to be rotated relative to the connecting frame portions 35. With this design, the lamp 100 is capable of providing directional light distribution by changing the orientation of the optical elements, i.e., the assembly of the light assembly frame 15 and the assembly of the light emitting diodes (LEDs) 50, and the flexible printed circuit board (PCB) 51, to a desired position. The optical elements, i.e. the assembly of the light assembly frame 15 and the assembly of the light emitting diodes (LEDs) 50, and the flexible printed circuit board (PCB) 51, can swivel to allow for tailored light distribution on a subject.

FIG. 6 depicts one embodiment of a lamp 100 including a rotational/gimbal function tailored for controlling light distribution on a subject, in which the optical diffuser 25, as well as the connected light assembly frame 15, and the assembly of the light emitting diodes (LEDs) 50 and flexible printed circuit board (PCB) 51, is in a straight position. In some examples, the optical diffuser 25, as well as the connected light assembly frame 15, and the assembly of the light emitting diodes (LEDs) 50 and flexible printed circuit board (PCB) 51, can be rotated via the above described rotational connection between the light assembly frame 15 and connecting frame portions 35, as measured from the straight position by a rotational increment equal to 5°, 10°, 20°, 30°, 40°, 50°, 60°, 70°, 80°, 90°, 100°, 110°, 120°, 130°, 140°, 150°, 160°, 170°, and 180°, as well as any range of rotational increments including a lower limit provided by one of the aforementioned examples, and a maximum limit provided by one of the aforementioned examples. For example, FIG. 4 depicts one embodiment of a lamp 100 in accordance with the present disclosure, in which the optical diffuser 25, as well as the connected light assembly frame 15, and the assembly of the light emitting diodes (LEDs) 50 and flexible printed circuit board (PCB) 51, is rotated 90° from the straight position. FIG. 5 depicts one embodiment of the present disclosure, in which the optical diffuser 25, as well as the connected light assembly frame 15, and the assembly of the light emitting diodes (LEDs) 50 and flexible printed circuit board (PCB) 51, is rotated to a tilted position between the straight position illustrated in FIG. 6 and the positioned rotated 90° from the straight position illustrated in FIG. 4. The rotational connection between the light assembly frame 15 and the connecting frame portions 35 can provide for the face of the optical diffuser 25 to be tilted to face upward or downward.

It is noted that the rotational connection between the light assembly frame 15 and the connecting frame portions 35 is not necessarily the only swivel connection that provides the gimbal function for the optical diffuser 25, as well as the connected light assembly frame 15, and the assembly of the light emitting diodes (LEDs) 50 and flexible printed circuit board (PCB) 51. For example, a second rotational connection may be present between the connecting frame portions 35 and the base housing 20. In this example, the second rotational connection present between the connecting frame portions 35, and the base housing 20 allows for the optical diffuser 25 to be rotated in a left or right direction, while the rotational connection between the connecting frame portions 35 and the light assembly frame 15 allows for the optical diffuser 25 to be rotated in an upward or downward direction.

The connecting frame portions 35 include a pathway for electrical communication between the driver electronics and the solid state light emitters 50, e.g., light emitting diodes (LEDs) 50. For example, lead wires extending from the driver electronics in the base housing 20 extend through the connecting frame portions 35 to the light emitting diodes (LEDs) in the light assembly frame 15. The power supplied from the base 21 of the base housing 20 is supplied to the LEDs 50 through the lead wires that can be housed in the connecting frame portions 35. In some embodiments, the connecting frame portions 35 may be composed of a metal or polymeric material. For example, when the connecting frame portions 35 are composed of a polymeric material, the connecting frame portions 35 can be composed of a resin material. The connecting frame portions 35 can be made of PBT (Polybutylene-terephthalate) or PET (Polyethylene-terephthalate) fire retarded plastic with a bromine-containing polymer and antimony oxide. The connecting frame portions 35 can be glass fiber filled.

In addition to the driver electronics, other electronics for the lamp and controllers may be present in the base housing 20, such as at least one controller for setting characteristics of light being projected by the light emitting diodes (LEDs) 50. The driver electronics and controller may each be integrated, i.e., either by formed on, formed in, or electrically connected thereto, to a printed circuit board (PCB) of an electronics package.

In some embodiments, the driver electronics of the electronics package converts AC electricity supplied to a room in which the lamp 100 is present into the DC used by LEDs 50. The driver electronics may also be referred to as a power converter. In addition to converting the AC power to rectified DC power, the driver electronics 30 may also adjust the voltage and/or current to provide the appropriate voltage and/or current to power the LEDs 50. In some embodiments, the driver electronics provide a constant current regulator that regulates current to a set value. In some embodiments, the driver/converter has a role in determining the power quality of the lamp 100, such as the total harmonic distortion and the power factor.

In some embodiments, the controller that is also positioned within the base housing 20 can provide for setting characteristics of light being projected by the LEDs 50. The controller may hereafter be referred to as a microcontroller. In some embodiments, the microcontroller can include at least one microprocessor, i.e. a computing device, that present can be present in an integrated circuit that can be is dedicated to perform tasks and execute specific applications. In addition to the processor, i.e., hardware processor, the microcontroller can contain memory, as well as programmable input/output peripherals. The memory, i.e., controller memory, of the microcontroller can include instructions for setting characteristics of light being projected by the light source, e.g., LEDs 50, in response to user selected settings, such as light color, intensity, temperature and/or dimming. The controller memory can be of any suitable memory type (e.g., RAM and/or ROM, or other suitable memory) and size, and in some cases may be implemented with volatile memory, non-volatile memory, or a combination thereof. The microcontroller may be configured, for example, to perform operations associated with the lamp 100 or a given light source, e.g., LED 50, in accordance with the instructions stored on the modules of the control memory for user selected settings, such as light color, intensity, temperature and/or dimming. In accordance with some embodiments, a given module of memory can be implemented in any suitable standard and/or custom/proprietary programming language, such as, for example: (1) C; (2) C++; (3) objective C; (4) JavaScript; and/or (5) any other suitable custom or proprietary instruction sets, as will be apparent in light of this disclosure. The modules of memory including the commands for user selected settings, such as light color, intensity, temperature and/or dimming, can be encoded, for example, on a machine-readable medium that, when executed by a processor, carries out the functionality of lamp 100 to adjust the lighting characteristics of light source, e.g., LEDs 50. The computer-readable medium may be, for example, a hard drive, a compact disk, a memory stick, a server, or any suitable non-transitory computer/computing device memory that includes executable instructions, or a plurality or combination of such memories. Other embodiments can be implemented, for instance, with gate-level logic or an application-specific integrated circuit (ASIC) or chip set or other such purpose-built logic. Some embodiments can be implemented with a microcontroller having input/output capability (e.g., inputs for receiving user inputs; outputs for directing other components) and a number of embedded routines for carrying out the device functionality. In a more general sense, the functional modules of memory can be implemented in hardware, software, and/or firmware, as desired for a given target application or end-use.

In accordance with some embodiments, the controller memory of the microcontroller within the lamp 100 have stored therein (or otherwise have access to) one or more applications. In some instances, the light source, e.g., LEDs 50, of the lamp 100 may be configured to receive input, for example, via one or more applications, e.g., the commands for user selected settings, such as light color, intensity, temperature and/or dimming, stored in the memory 51 of the microcontroller. For instance, the application that correlates the light performance to the commands for user selected settings, such as light color, intensity, temperature and/or dimming, may allow a user to program or configure a lamp 100 to adjust project light having characteristics, such as the light color, light intensity/dimming, or light color temperature, in response to user commands, i.e., user selected settings. In some embodiments, the user selected settings may be entered into an interface on the lamp 100. In other embodiments, the user selected settings may be entered from a remote interface, which can include a mobile computing device.

In some embodiments, a communication module also present within the base housing 20 may provide the transmitter/receiver for the lamp for receiving instructions for the remote interface. In some embodiments, may be in communication with at least the microcontroller of the lamp 100. The communication module can provide the means by which a user of the lamp 100 can program the lamp 100. In some embodiments, the communication module can be configured for wired (e.g., Universal Serial Bus or USB, Ethernet, FireWire, etc.) and/or wireless (e.g., Wi-Fi, Bluetooth, etc.) communication, as desired. In accordance with some embodiments, communication module may be configured to communicate locally and/or remotely utilizing any of a wide range of wired and/or wireless communications protocols, including, for example: (1) a digital multiplexer (DMX) interface protocol; (2) a Wi-Fi protocol; (3) a Bluetooth protocol; (4) a digital addressable lighting interface (DALI) protocol; (5) a ZigBee protocol; and/or (6) a combination of any one or more thereof. It should be noted, however, that the present disclosure is not so limited to only these example communications protocols, as in a more general sense, and in accordance with some embodiments, any suitable communications protocol, wired and/or wireless, standard and/or custom/proprietary, may be utilized by the communication module, as desired for a given target application or end-use. In some instances, communication module may be configured to facilitate inter-system communication between the lamp and/or communication between lamp(s) and a mobile computing device.

Programming the commands to the microcontroller may be achieved using a computer and/or mobile computing device by hard wire connection to the lamp or by wireless communication. The computer and mobile computing device can each be a machine for computing calculations including a hardware processor. The computer may be a desktop type computer and/or laptop type computer. One example of mobile computing device that is suitable for use with the light control methods, systems and computer program products that are described herein includes a phone having at least an operating system capable of running applications, which can be referred to as a smart phone. In addition to cellular access, the smart phones can also have internet access. Other examples of a mobile computing devices that are suitable for use with the methods, systems and computer program products described herein include a tablet or phablet computer; a personal digital assistant (PDA); a portable media player (PMP); a cellular handset; a handheld gaming device; a gaming platform; a wearable or otherwise body-borne computing device, such as a smartwatch, smart glasses, or smart headgear; and/or a combination of any one or more thereof.

Communication between the computer/mobile computing device and the lamp for projecting the light is typically through a wireless connection, such as WiFi, Bluetooth, internet based connections, cellular connections and combinations thereof. In other embodiments, the communication between the computer/mobile computing device and the lamps projecting the light may be through a wired connection, such as a local network connection, e.g., Ethernet type connection. As described herein, the lamp 100 can include a communications module providing for communication between controller type devices for programming and maintenance purposes, such as the computer/mobile computing device, as well as communication with other neighboring lamps 100. The lamp 100 and the mobile computing device may be configured to be communicatively coupled using, for example, server/network.

In some embodiments, the electronics package housed within the base housing 20 may further include an EMI filter and bridge rectifier (collectively referred to as EMI filter); and a power converter control and protection circuit. The EMI filter and bridge rectifier filters the high frequency noise to keep it within the limits of the FCC standard. The bridge rectifier and filter rectifies the AC input to DC output. In some embodiments, a filter capacitor stores the energy and support the peak current required by the power conversion stage. The power converter and protection circuit may also provide protection against short circuit and overvoltage of the power converter.

It is noted that the above descriptions of electrical components that are present within the base housing 20 is provided for illustrative purposes only, and is not intended to limit the present disclosure. Other electrical components may also be present within the base housing 20.

Figure 7:
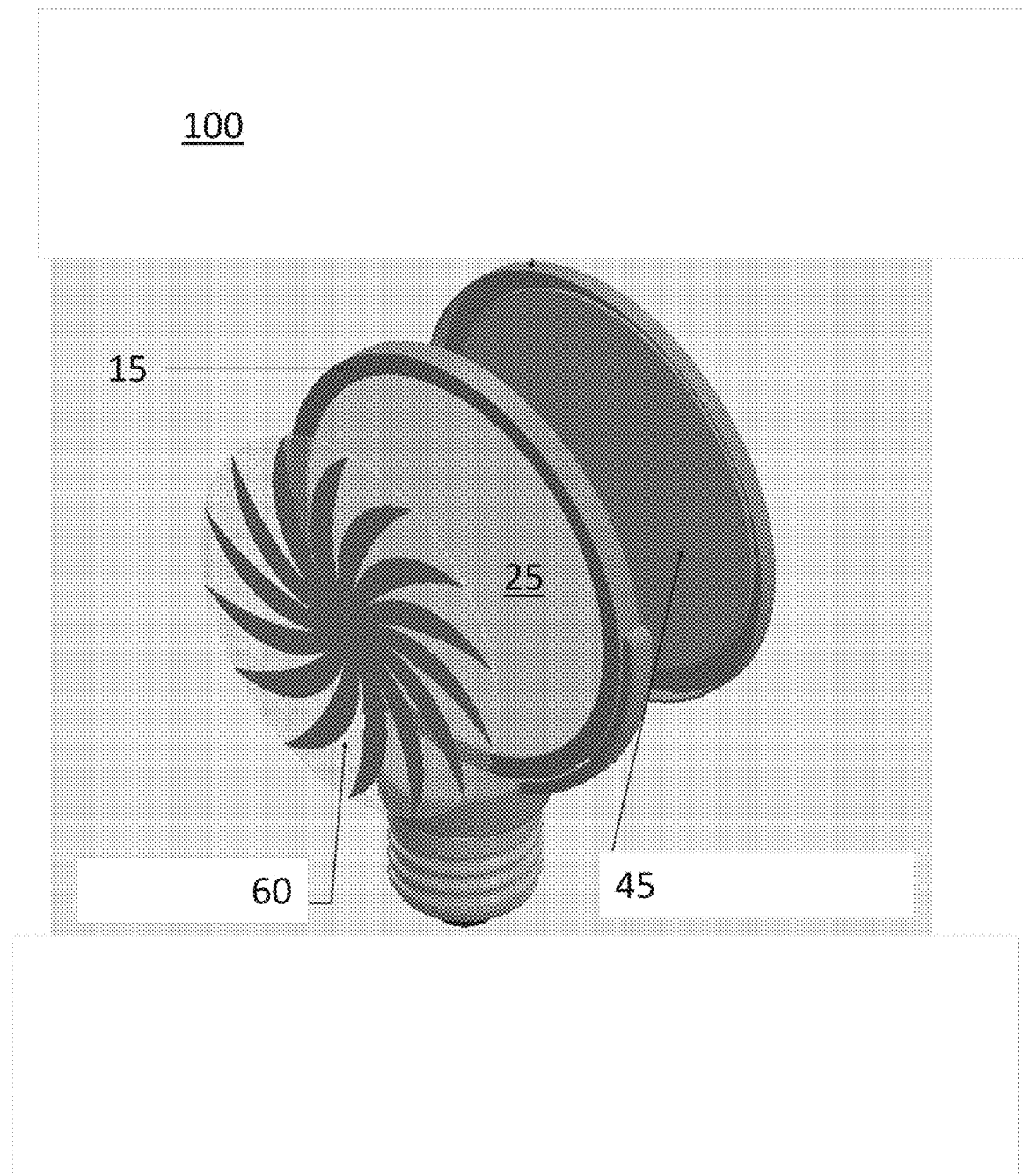
FIG. 7 is a perspective view of another embodiment of a lamp having a plurality of solid state light emitters, e.g., light emitting diodes (LEDs), that are positioned within a track that also retains an optical diffuser, wherein the lamp further includes a decorative overlay.

FIG. 7 depicts one embodiment of a lamp 100 having a plurality of solid state light emitters, e.g., light emitting diodes (LEDs), that are positioned within a track that also retains an optical diffuser, wherein the lamp 100 further includes a decorative overlay 60. The decorative overlay 60 is present on the optical diffuser 25. For example, the decorative overly 60 may be provided by a design that is painted onto the optical diffuser 25. In another example, the decorative overlay 60 is applied by decal. In yet another example, the decorative overlay is etched into the optical overlay. The optical overlay 60 may be present on any of the optical diffusers 25, 25a, 25b that are depicted in FIGS. 1 and 3-7.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Spatially relative terms, such as "forward", "back", "left", "right", "clockwise", "counter clockwise", "beneath," "below," "lower," "above," "upper," and the like, can be used herein for ease of description to describe one element's or feature's relationship to another elements) or feature(s) as illustrated in the FIGs. It will be understood that the spatially relative terms are intended to encompass different orientations of the device in use or operation in addition to the orientation depicted in the FIGs.

Having described preferred embodiments of an edgelit light emitting diode retrofit lamp, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims,

What is claimed is:
1. A lamp comprising:
at least one optical diffuser having textured surface to direct light, the at least one optical diffuser having a perimeter defined by an enclosed arc;
a frame present on at least a portion of a perimeter of the optical diffuser, the frame including at least two sidewall rails defining a track therebetween;
a plurality of light emitting diodes that are present between the frame and the optical diffuser, the plurality of light emitting diodes positioned within the frame to emit light towards the optical diffuser that is surrounded by the plurality of light emitting diodes, wherein the at least one optical diffuser comprises a first and a second optical diffuser, wherein a first optical diffuser contacts a first sidewall rail of the at least two sidewall rails of the track, a second optical diffuser contacts a second sidewall rail of the at least two sidewall rails of the track, and the light emitting diodes are present within a groove between the first and second optical diffusers; and
a base structure including a socket for engaging a lamp fixture, the socket in electrical communication to the plurality of light emitting diodes.

2. The lamp of claim 1, wherein the light emitting diodes are positioned about an entirety of the perimeter of the at least one optical diffuser.

3. The lamp of claim 2, wherein the frame includes an interior surface including a track provided by a groove positioned between at least two sidewall rails, wherein the light emitting diodes are present within the groove, and the optical diffuser contacts the sidewall rails to provide that the light emitting diodes are encapsulated between the frame and the optical diffuser.

4. The lamp of claim 1, wherein the optical diffuser has a plastic composition selected from the group consisting of acrylic, polystyrene, polycarbonate, Cyclic Olefin Polymer (COP), Cyclic Olefin Copolymer (COC), NAS copolymer and combinations thereof.

5. The lamp of claim 1, wherein the at least one optical diffuser has said perimeter defined by at least one arc.

6. The lamp of claim 1 further comprising a reflector positioned on one side of the at least one optical diffuser.

7. The lamp of claim 1, wherein the light emitting diodes are surface mount light emitting diodes that are mounted on a flexible substrate.

8. A lamp comprising:
a frame including an interior surface having a track provided by a groove positioned between at least two sidewall rails;
a first optical diffuser contacting a first rail of the at least two sidewall rails;
a second optical diffuser contacting a second rail of the at least two sidewall rails;
a plurality of light emitting diodes present around a perimeter of the frame within the groove between the first and second optical diffusers, wherein the frame has at least one arc and the plurality of light emitting diodes is present along at least a majority of the perimeter, the plurality of light emitting diodes positioned within the frame to emit light substantially towards the first and second optical diffusers that are surrounded by the plurality of light emitting diodes; and
a base structure including a socket for engaging a lamp fixture, the socket in electrical communication to the plurality of light emitting diodes.

9. The lamp structure of claim 8, wherein the optical diffuser has a plastic composition selected from the group consisting of acrylic, polystyrene, polycarbonate, Cyclic Olefin Polymer (COP), Cyclic Olefin Copolymer (COC), NAS copolymer and combinations thereof.

10. A lamp structure comprising:
a light emitting assembly including a first and a second optical diffuser having textured surface to direct light, a light emitting assembly frame having at least two sidewall rails defining a track therebetween, wherein the frame is present on at least a portion of a perimeter of the first and the second optical diffuser, and a plurality of solid state light emitters that are present between the light emitting assembly frame and the first and the second optical diffuser, the solid state light emitters light that is received by the first and the second optical diffuser, wherein a first optical diffuser contacts a first sidewall rail of the at least two sidewall rails of the track, a second optical diffuser contacts a second sidewall rail of the at least to sidewall rails of the track, and the light emitting diodes are present within the groove between the first and second optical diffusers;
a base structure including driver electronics in electrical communication to a socket for engaging a lamp fixture; and connecting frame portions connecting the base structure to the light emitting assembly, wherein the connecting frame portions including a pathway for electrical communication between the electronics and the solid state light emitters and the connecting frame portions in rotational engagement to the light emitting assembly.

11. The lamp structure of claim 10, wherein the plurality solid state light emitter are light emitting diodes.

12. The lamp structure of claim 11, wherein the light emitting diodes are positioned about an entirety of the perimeter of the at least one of the first and second optical diffuser.

13. The lamp structure of claim 10, wherein at least one of the first and second optical diffuser have a plastic composition selected from the group consisting of acrylic, polystyrene, polycarbonate, Cyclic Olefin Polymer (COP), Cyclic Olefin Copolymer (COC), NAS copolymer and combinations thereof.

14. The lamp structure of claim 10, wherein the at least one optical diffuser has said perimeter defined by at least one arc.

15. The lamp structure of claim 10 further comprising a reflector positioned on one side of the at least one of the first and second optical diffuser.

16. The lamp structure of claim 10, wherein the light emitting diodes are surface mount light emitting diodes that are mounted on a flexible substrate.

* * * * *